United States Patent [19]
Hodoshima

[11] Patent Number: 5,208,469
[45] Date of Patent: May 4, 1993

[54] WAFER SCALE INTEGRATED CIRCUIT AND METHOD OF FORMING SIGNAL PROPAGATION PATH THEREIN
[75] Inventor: Toshiyuki Hodoshima, Kawasaki, Japan
[73] Assignee: Fujitsu Limited, Kanagawa, Japan
[21] Appl. No.: 726,081
[22] Filed: Jul. 5, 1991
[30] Foreign Application Priority Data
Jul. 6, 1990 [JP] Japan .................................. 2-177440
[51] Int. Cl.⁵ ............................................. H01L 27/02
[52] U.S. Cl. .................................... 257/208; 257/499; 257/618
[58] Field of Search .......................... 357/40, 41, 68, 74, 357/75; 148/DIG. 162; 365/200, 201
[56] References Cited
U.S. PATENT DOCUMENTS
5,016,080  5/1991  Giannella ............................. 357/40
5,105,425  4/1992  Brewer ................................. 365/201
5,124,776  6/1992  Tanizawa et al. ..................... 357/45

Primary Examiner—Edward J. Wojciechowicz
Assistant Examiner—Sara W. Crane

[57] ABSTRACT

A wafer scale integrated circuit includes a plurality of functional circuit blocks arranged in rows on a wafer, each functional circuit block having four corners, and a signal propagation path (spiral) serially connecting some of the plurality of functional circuit blocks. Each functional circuit block is arranged in a zigzag manner such that at least two corners of a functional circuit block in one row are located approximately in the center of respective sides of corresponding functional circuit block in a row adjacent to that row. As a result, it is possible to reduce the number of branch signal paths to the lowest possible value when forming the spiral, and thus facilitate an external control for forming the spiral to thereby shorten a processing time needed for the control, while increasing a utilization efficiency of non-defective chips.

3 Claims, 7 Drawing Sheets

PRIOR ART $C_1 \sim C_{13}$ ·· CHIP
$L_1 \sim L_{13}$ ·· CONTROL LOGIC
$M_1 \sim M_{13}$ ·· MEMORY
———→ ··· SPIRAL

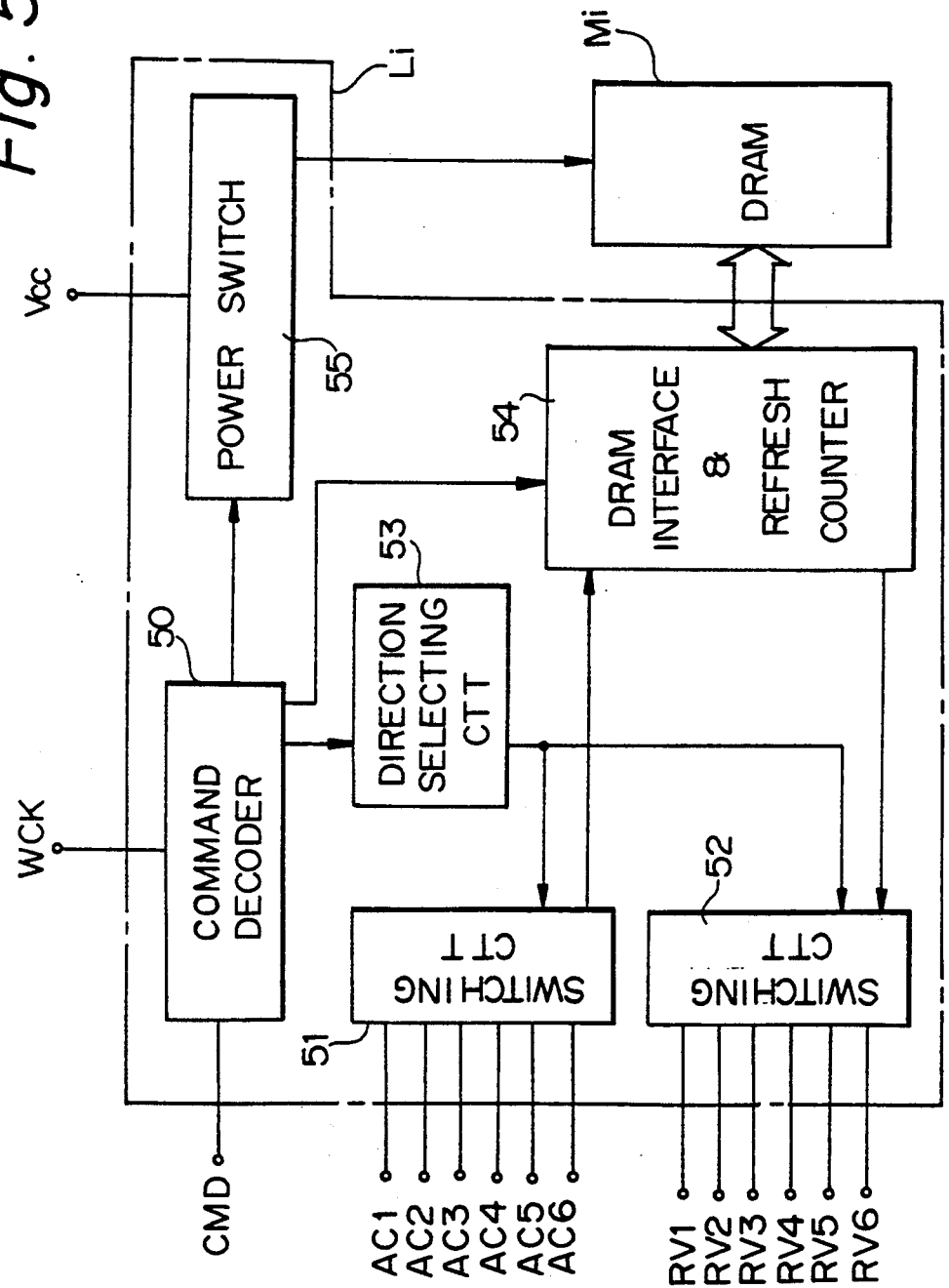

☐ ··· NON-DEFECTIVE CHIP

☒ ··· DEFECTIVE CHIP (PRESENT EXAMPLE)

(PRIOR ART EXAMPLE)

WAFER SCALE INTEGRATED CIRCUIT AND METHOD OF FORMING SIGNAL PROPAGATION PATH THEREIN

BACKGROUND OF THE INVENTION

1. Field of the Invention

The present invention relates to a wafer scale integrated circuit (hereinafter referred to as a WSI circuit) including a plurality of functional circuit blocks arranged on a wafer. More particularly, it relates to a technique of electrically connecting non-defective functional circuit blocks in the WSI circuit to thereby form a signal propagation path (hereinafter referred to as a spiral). Note, for convenience, each of the functional circuit blocks is hereinafter referred to as a "chip".

2. Description of the Related Art

In a known typical WSI circuit, since a plurality of chips are arranged in the form of a grid on a wafer, the number of chips adjacent to an arbitrary chip is four at maximum. Accordingly, in the process of forming a "spiral", the number of chips capable of being connected to a chip located at the head of the spiral is limited to three at maximum, even if the adjacent chips are all non-defective chips.

When forming the spiral, defective chips present on the wafer cannot be incorporated therein, and accordingly, depending upon the distribution of the defective chips, it becomes necessary to form a branch signal path which turns away from the original signal propagation path (spiral).

Where a number of branch signal paths are present on the wafer, however, a drawback arises in that it is cumbersome and difficult to control chips on the branch signal path, and accordingly, the control of the spiral forming becomes complicated. This leads to a prolongation of the processing time for the spiral forming. Also, since the number of adjacent chips is limited to four at maximum, the efficiency of the utilization of non-defective chips becomes relatively lower, depending upon the distribution of the non-defective chips.

Note, the problems in the prior art will be explained in detail later, in contrast with the preferred embodiments of the present invention.

SUMMARY OF THE INVENTION

An object of the present invention is to provide a WSI circuit and a method of forming a spiral therein by which the number of branch signal paths is reduced to the lowest possible value when forming the spiral, and accordingly, an external control for the spiral forming is facilitated to thereby contribute to a shortening of the processing time needed for the control.

Another object of the present invention is to provide a WSI circuit and a method of forming a spiral therein by which a utilization efficiency of non-defective chips is increased.

According to one aspect of the present invention, there is provided a WSI circuit including: a plurality of functional circuit blocks arranged with units of rows on a wafer, each functional circuit block having four corners; and a signal propagation path serially connecting some of the plurality of functional circuit blocks, wherein each functional circuit block is arranged in zigzags such that at least two corners of a functional circuit block in a certain row are located approximately in the center of respective sides of corresponding functional circuit blocks in a row adjacent to the certain row.

Also, according to another aspect of the present invention, there is provided a method of forming a signal propagation path in the WSI circuit according to the above aspect of the present invention, the method including: a first step of determining a non-defective functional circuit block as a starting point of the signal propagation path, from among the plurality of functional circuit blocks; a second step of determining whether a functional circuit block adjacent to the determined non-defective functional circuit block is defective or not; a third step of electrically connecting the judged functional circuit block to the signal propagation path where a result of the second step indicates that the judged functional circuit block is not defective; and a fourth step of repeating the second and third steps to thereby form the signal propagation path.

BRIEF DESCRIPTION OF THE DRAWINGS

Other objects and features of the present invention will be described hereinafter in detail by way of preferred embodiments with reference to the accompanying drawings, in which:

FIG. 4b is a view showing an example of the spiral in FIG. 4a;

FIG. 5 is a block diagram illustrating a concrete constitution of each chip shown in FIG. 4a;

DESCRIPTION OF THE PREFERRED EMBODIMENTS

For a better understanding of the preferred embodiment of the present invention, the problems in the prior art will be explained with reference to FIGS. 1 and 2.

Figure 1:
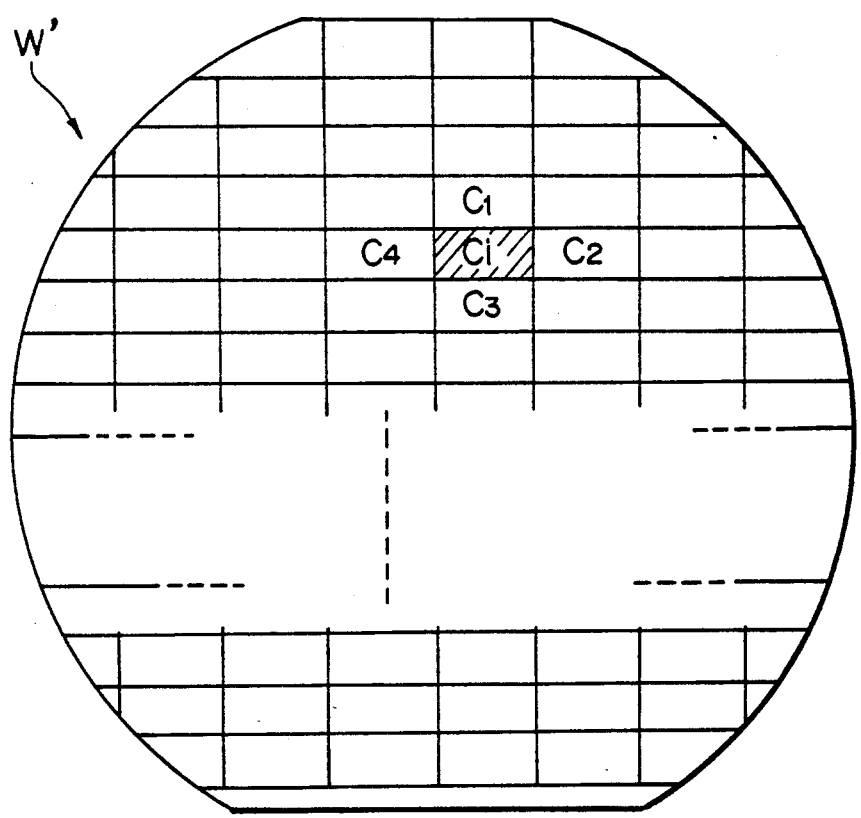
FIG. 1 is a view schematically illustrating a constitution of a prior art WSI circuit.

FIG 1. schematically shows a constitution of a prior art WSI circuit.

As shown in FIG. 1, the conventional WSI circuit W' is constituted such that a plurality of chips are arranged in the form of a grid on a wafer. Accordingly, chips adjacent to an arbitrary chip Ci (hatched portion) are chips $C_1$ to $C_4$ located in four directions, i.e., up, down, right and left, viewed from the arbitrary chip Ci, and the number thereof is four at maximum, except at the peripheral region of the wafer. As a result, when a signal propagation pat (spiral) is formed, the number of chips capable of being connected to a chip located at the head of the spiral (hereinafter referred to as a lead-off chip) is limited to three at maximum, even if the adjacent chips are all non-defective chips.

Figure 2:
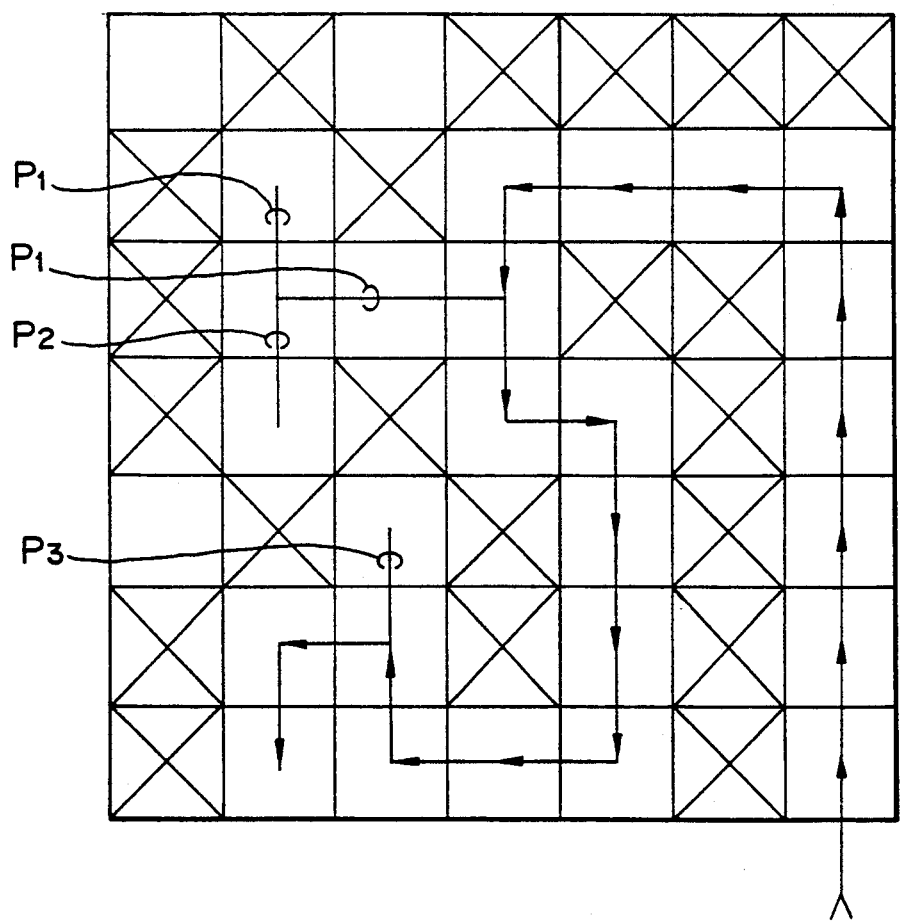
FIG. 2 is a view for explaining problems occurring due to the constitution of FIG. 1.
Figure 7A:
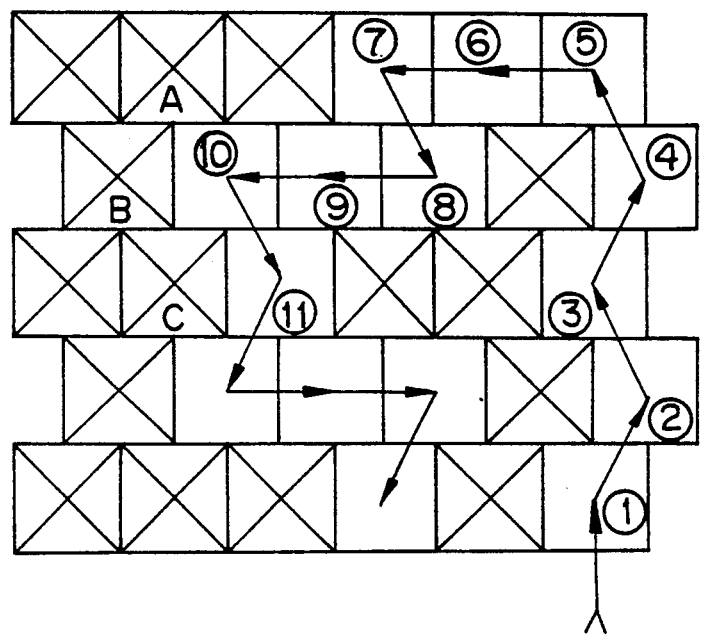
FIGS. 7a and 7b are views showing the process of forming the spiral, based on the example of FIG. 3, compared with that based on the prior art example of FIG. 1.
Figure 7B:
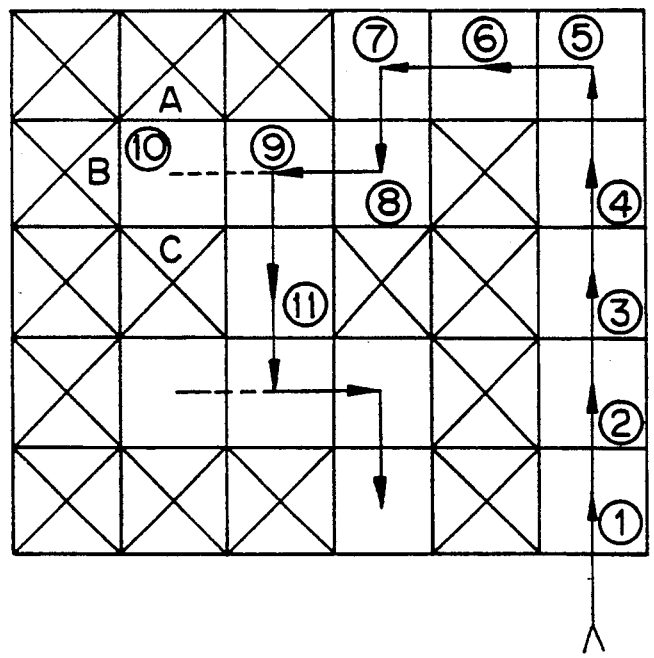

In this case, where a number of defective chips are present on the wafer as shown in FIG. 2, of course, the spiral must be formed without connecting the defective chips to the spiral. Accordingly, depending upon the distribution of the defective chips, it becomes necessary to form a branch signal path (see references $P_1$ to $P_3$) which turns away from the original signal propagation path. If circumstances require, it becomes necessary to further form another branch signal path ($P_2$) branching from a branch signal path ($P_1$). This results in a complexity of the entire spiral. Especially, where a chip is surrounded by defective chips located in three directions therefrom (e.g., chip 10 of FIG. 7b), a branch signal path inevitably must be formed as shown in FIG. 7b by a broken line, and thus the entire spiral is complicated.

Also, a signal propagation path (spiral) is typically formed by a combination of controls from an external controller and an adjacent chip at an upstream side of a spiral. Each control is carried out by applying a predetermined control signal to a lead-off chip on the spiral and judging a response of the lead-off chip to the predetermined control signal. An example of such a control is taught, for example, in the publication "Electronic Parts and Materials", Vol. 28, No. 6, pp. 71 to 75, published on June, 1989, by Kogyo Chosa-Kai (Industry Investigation Commission). Accordingly, where a great number of branch signal paths are formed on the wafer, it takes a longer time to apply a control signal to the lead-off chip and judge a response signal thereto, compared with a case in which there are very few branch signal paths.

Namely, where some branch signal paths are present on the wafer, a problem occurs in that it is cumbersome and difficult to control chips on the branch signal path, and accordingly, the control for forming the spiral becomes complicated. This considerably prolongs the processing time needed for the spiral forming, and thus is not preferable.

Also, since the number of chips adjacent to an arbitrary chip is limited to four at maximum, another problem arises in that, depending upon the distribution of non-defective chips, a utilization efficiency of the non-defective chips becomes relatively low.

Figure 3:
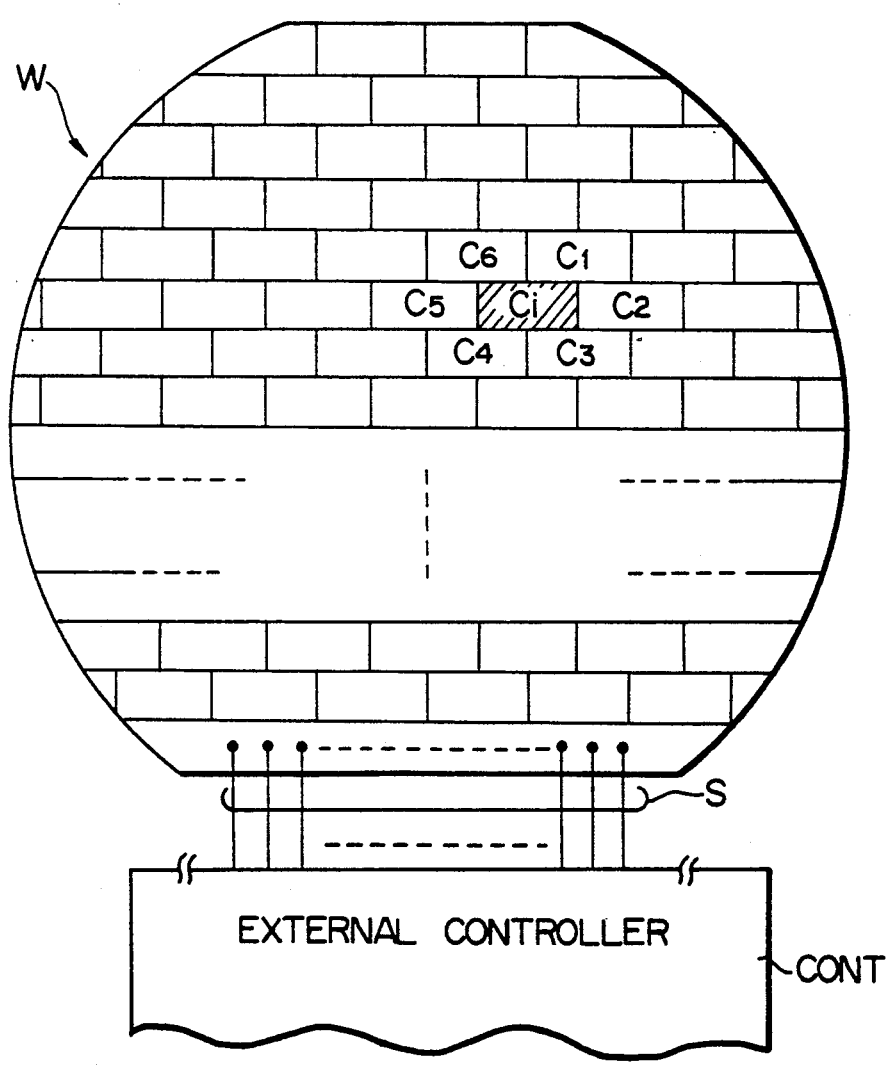
FIG. 3 is a view schematically illustrating a constitution of the WSI circuit according to an embodiment of the present invention.

FIG. 3 schematically illustrates a constitution of the WSI circuit according to an embodiment of the present invention.

The WSI circuit W of the present embodiment is constituted such that a plurality of chips are arranged in rows on a wafer, and each of the chips on the wafer is arranged in a zigzag manner such that the respective corners of a chip in one row are located in the center of respective sides of corresponding chips in a row adjacent to that row. As a result, it becomes possible to increase the number of chips adjacent to an arbitrary chip Ci (hatched portion) to six ($C_1$ to $C_6$) at maximum, except at the peripheral region of the wafer.

Therefore, in the process of forming a spiral, even if a lead-off chip is surrounded by defective chips, the number of chips capable of being connected to the lead-off chip becomes relatively higher (in this case, five chips), compared with the prior art example (three chips). This is because the probability that five chips adjacent to the lead-off chip are all defective is extremely low. As a result, it is possible to relatively reduce the number of cases where a branch signal path must be formed as seen in the prior art (see FIG. 2). Also, it is possible to prevent the spiral from being brought to a "dead end" state.

Reference CONT denotes an external controller, which is connected via a plurality of signals S to each chip of the WSI circuit W and controls each chip to form the spiral.

Figure 4A:
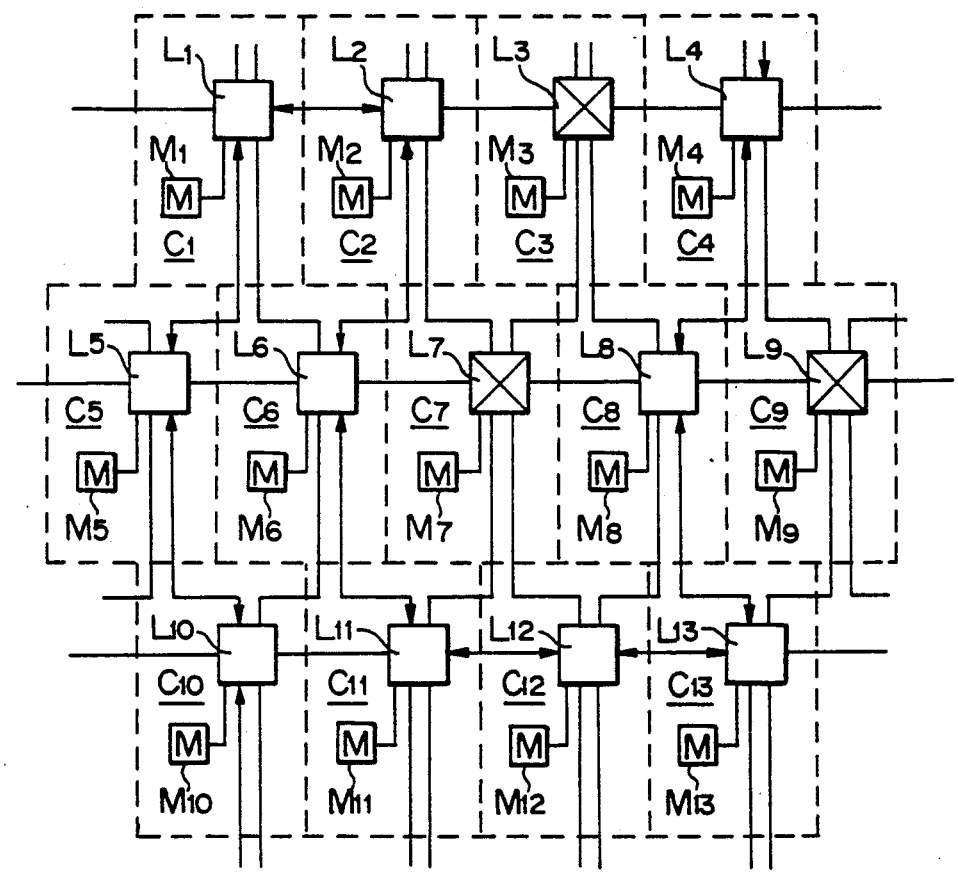
FIG. 4a is a view schematically illustrating a constitution of each chip shown in FIG. 3 and a link therebetween.
Figure 4B:
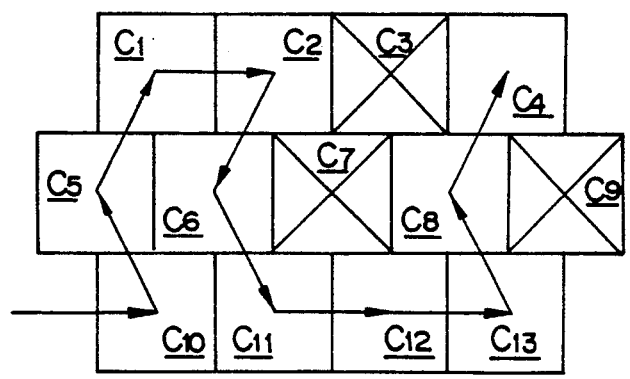

FIG. 4a schematically illustrates a constitution of each chip and a link therebetween, and FIG. 4b shows an example of the spiral.

In the illustration, the portion surrounded by a broken line indicates each chip. In the present example, thirteen chips $C_1$ to $C_{13}$ are arranged in a zigzag manner. Each chip includes a control logic unit Li (i=1 to 13) which effects processings needed for the spiral forming as stated later, and a memory unit Mi (i=1 to 13) in the form of a dynamic random access memory (DRAM) as shown in FIG. 5. Note, the illustration of FIG. 4a shows an example in which three chips are defective (x is marked on the respective control logic units $L_3$, $L_7$ and $L_9$).

FIG. 5 illustrates a concrete constitution of each chip shown in FIG. 4a.

In FIG. 5, reference Vcc denotes a power supply voltage; reference WCK denotes a pulsed clock signal having a constant and relatively short period; reference CMD denotes a pulsed command signal having a variable and relatively long period, compared with that of the clock signal WCK; references AC1 to AC6 denote access signals each for selecting a chip to be next connected; and references RV1 to RV6 denote receiving signals each returning from the chip to be next connected. The power supply voltage Vcc is fed to each chip from a power supply wiring (not shown) provided on the wafer. The clock signal WCK and the command signal CMD are directly fed from the external controller CONT, or fed via other non-defective chips and the spiral from the external controller CONT. Also, each of the access signals AC1 to AC6 and each of the receiving signals RV1 to RV6 are coupled to a corresponding one of the adjacent six chips, respectively.

The illustrated control logic unit Li includes: a command decoder 50 responsive to the clock signal WCK and for decoding the command signal CMD; a switching circuit 51 for selecting one of the access signals AC1 to AC6; a switching circuit 52 for selecting one of the receiving signals RV1 to RV6; a direction selecting circuit 53 responsive to a result of the decoding and for causing each of the switching circuits 51 and 52 to select the access signal and the receiving signal, respectively, corresponding to the designated direction of connection; a DRAM interface and refresh counter 54 responsive to a result of the decoding and for generating all of the signals necessary for the operation of the memory unit Mi (DRAM); and a power switch 55 responsive to a result of the decoding and for supplying the power supply voltage Vcc to the memory unit Mi.

In the above constitution, the command decoder 50 has a function of determining by how much the period of the command signal CMD is greater than that of the clock signal WCK and, changing the command in accordance with a result of the determination. Each of the commands thus determined is, for example, as follows:

| | | |
|---|---|---|
| Global | CMND = 01 | INIT |
| Primed | CMND = 02 | ACONE |
| Primed | CMND = 03 | ACZERO |
| Primed | CMND = 04 | TRP |
| Primed | CMND = 05 | STSP |
| Global | CMND = 06 | CLR-SEL |
| Global | CMND = 07 | CLR-PARK |

| | -continued | |
|---|---|---|
| Global | CMND = 08 | CLR-FUN |
| Local | CMND = 09 | SEL1 |
| Local | CMND = 10 | SEL2 |
| Local | CMND = 11 | SEL3 |
| Local | CMND = 12 | SEL4 |
| Local | CMND = 13 | SEL5 |
| Local | CMND = 14 | SEL6 |
| Local | CMND = 15 | READ |
| Local | CMND = 16 | WRITE |
| Local | CMND = 17 | ACLOAD |
| Local | CMND = 18 | SCR |
| Local | CMND = 19 | SCLEN |
| Local | CMND = 20 | RPON |

In the above list, "Global" and "Primed" indicate a command for all of the chips on the wafer, respectively, and "Local" indicates a command for an individual chip. Also, "INIT" indicates an initial command for enabling the operation of each chip immediately after the power is made ON; "ACONE" a command for setting an address counter bit to "1"; "ACZERO" a command for setting the address counter bit to "0"; "TRP" a command for triggering a count-up of the row address in the read/write operation, in particular, for counting up the next row address in the page-out mode; "STSP" a command for starting or stopping the data transfer in the read/write operation; "CLR-SEL" a command for clearing a content of a selection register provided in the direction selecting circuit 53, i.e., the directions of connection to the adjacent chips; "CLR-PARK" a command for clearing a token used for identifying a chip located at the head of the spiral (lead-off chip); "CLR-FUN" a command for clearing a content of a function register provided in the DRAM interface and refresh counter 54; "SEL1" to "SEL6" each command for determining one of the access signals AC1 to AC6 and one of the receiving signals RV1 to RV6; "READ" a command for setting the memory unit Mi (DRAM) to the read mode; "WRITE" a command for setting the DRAM to the read-modified write mode; "ACLOAD" a command for setting the address counter to the load mode; "SCR" a command for clearing a content of the refresh counter (54); "SCLEN" a command for determining the refresh cycle of each chip on the wafer, in particular, for determining for how many seconds the interrupt time should be set, or whether or not the refresh operation should be carried out; and "RPON" a command for turning ON or OFF the power to be fed to the memory unit Mi (DRAM).

The spiral is formed by sequentially outputting the access signals AC1 to AC6, to thereby scan the six directions of connection to the adjacent chips, electrically connecting its own control logic unit to the adjacent control logic unit from which the corresponding receiving signal RVi has been returned, and repeating the above processings. Note, where a chip adjacent to a non-defective chip is defective, the corresponding receiving signal RVi is not returned from the adjacent chip to the non-defective chip. In this case, the non-defective chip scans the next adjacent chip.

Additionally, where the control logic unit of an arbitrary chip Ci (see FIG. 3) selects a chip C₁ as the chip to be next connected, and determines the refresh cycle thereof, the period of the command signal CMD is selected such that it is nine times that of the clock signal WCK and then nineteen times that thereof (see the above list).

Figure 6:
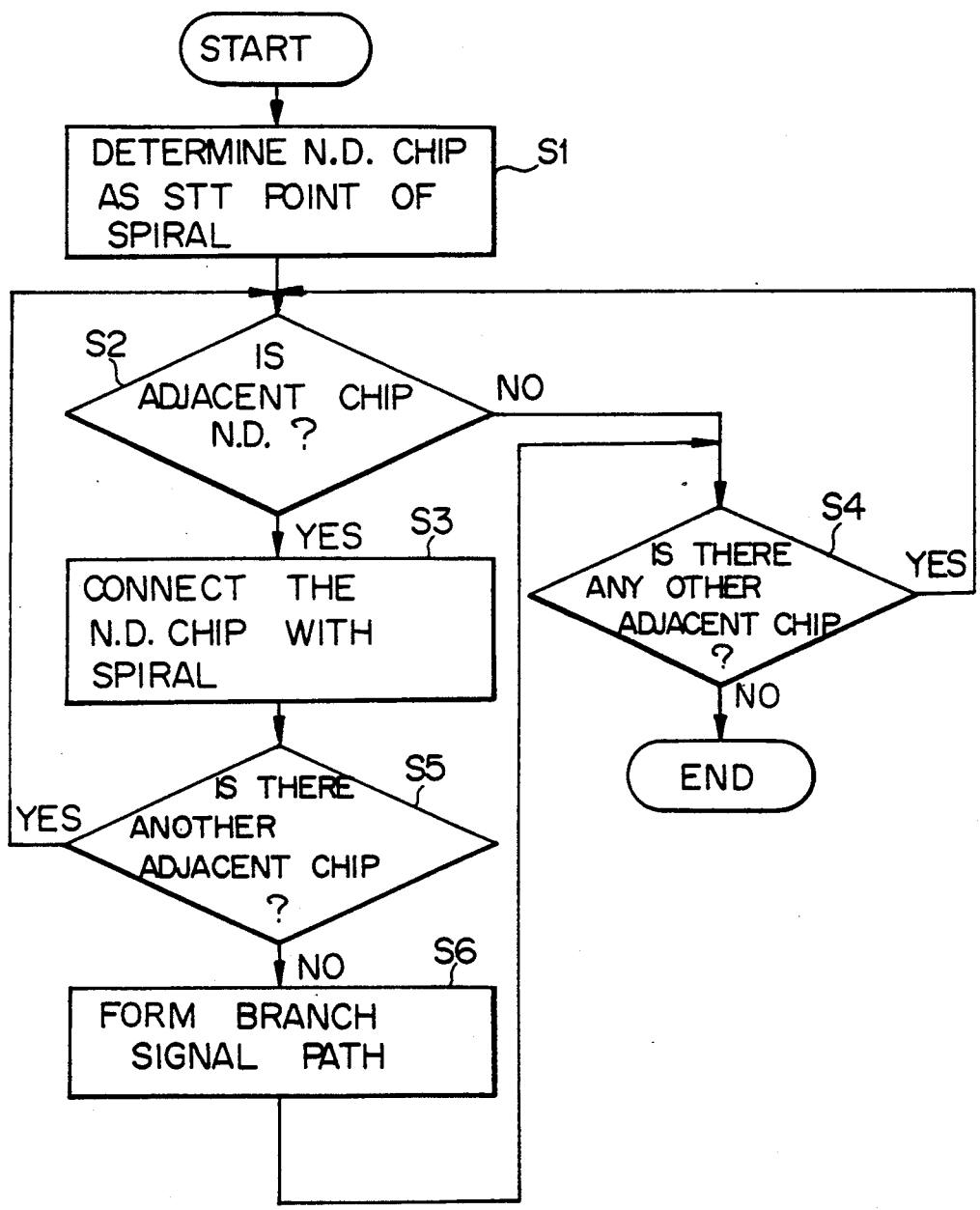
FIG. 6 is a flowchart representing processings carried out by the control logic unit shown in FIGS. 4a and 5.

Next, the process of forming the spiral will be explained with reference to the flowchart of FIG. 6 and an example of the spiral shown in FIG. 7a.

First, at step S1, a non-defective chip is determined as a starting point of the spiral. This is carried out by applying a control signal for a determination of an expected function from the external controller CONT to the control logic unit Li of an arbitrary chip (chip ① of FIG. 7a) and judging a response signal thereto.

At the next step S2, the control logic unit of the chip ① determines whether an adjacent chip ② is non-defective (YES) or defective (NO). This is carried out, in the same manner as in step S1, by applying a predetermined control signal from the non-defective chip ① to the control logic unit Li of the adjacent chip ② and judging a response signal thereto.

If a result of the determination at step S2 indicates YES, the control proceeds to step S3, where the judged non-defective chip ② is electrically connected to the originally determined non-defective chip ①. As a result, part of the spiral is formed. After the step S3, the control proceeds to step S5.

On the other hand, if the result of the judgment at step S2 indicates NO, the control proceeds to step S4. In this case, the control logic unit of the chip ① determines whether there is any other adjacent chip (YES) or not (NO). This is carried out in the same manner as in step S2. If a result of the determination at step S4 indicates NO, the control comes to an "END" and, if the result thereof indicates YES, the control returns to step S2 and thus the above processings are repeated.

At step S5, the control logic unit of the chip ② determines whether there is an adjacent chip to be next connected (YES) or not (NO). This is also carried out in the same manner as in step S2. If a result of the determination at step S5 indicates NO, the control proceeds to step S6 and, if the result thereof indicates YES, the control returns to step S2 and thus the above processings are repeated.

At step S6, the control carries out a processing for bringing the signal propagation path back to the adjacent non-defective chip located at the upstream side thereof. As a result, a branch signal path is formed. This corresponds to the "bring-back" processing from the chip ⑩ to the chip ⑨ in the prior art (FIG. 7b). In this case, the control corresponds to the control logic unit of the chip ⑩. Note, although not shown in the present example (FIG. 7a), the above "bring-back" processing may be carried out depending upon the distribution of the defective chips. Such a case, however, is extremely rare, compared with the prior art chip-layout in the form of a grid. After the step S6, the control proceeds to step S4.

As explained above, since the WSI circuit W of the present embodiment adopts the constitution in which each chip on the wafer is arranged in a zigzag manner (see FIG. 3), it is possible to increase the number of chips adjacent to an arbitrary chip up to six at maximum. Therefore, it is possible to form the spiral without forming any branch signal path, or with a relatively small number of branch signal paths, even if a branch signal path must be formed. As a result, it becomes possible to facilitate the control for forming the spiral by the external controller CONT and thereby reduce the processing time therefor.

Also, since the number of chips capable of being connected to a certain chip in the process of forming the spiral becomes relatively higher, compared with the prior art, it is possible to increase the utilization efficiency of non-defective chips.

Although the present invention has been disclosed and described by way of one embodiment, it is apparent to those skilled in the art that other embodiments and modifications of the present invention are possible without departing from the spirit or essential features thereof.

What is claimed is:

1. A wafer scale integrated circuit comprising:
   a plurality of functional circuit blocks arranged in rows on a wafer, each functional circuit block having four corners; and
   a signal propagation path serially connecting some of the plurality of functional circuit blocks,
   wherein each functional circuit block is arranged in a zigzag manner such that at least two corners of a functional circuit block in one row are located approximately in the center of respective sides of corresponding functional circuit blocks in a row adjacent to that row.

2. A wafer scale integrated circuit as set forth in claim 1, wherein each of the functional circuit blocks arranged on the wafer comprises a control logic unit, the respective control logic unit being responsive to a control signal fed from outside of the wafer or fed from an adjacent functional circuit block lacated at an upstream side of the signal propagation path, determining whether an adjacent functional circuit block at a downstream side thereof is defective, and electrically connecting the determined functional circuit block to the signal propagation path where the determined functional circuit block is not defective, to thereby form a part of the signal propagation path.

3. A wafer scale integrated circuit as set forth in claim 2, wherein the control logic unit of each functional circuit block comprises:
   means responsive to a clock signal and a command signal fed from the outside of the wafer, for decoding the command signal and changing the command in accordance with a ratio of a period of the command signal to that of the clock signal;
   means responsive to a result of the decoding, for designating a direction corresponding to a functional circuit block to be next connected; and
   means for effecting a communication with a functional circuit block located in the designated direction.

* * * * *